Figure 1:
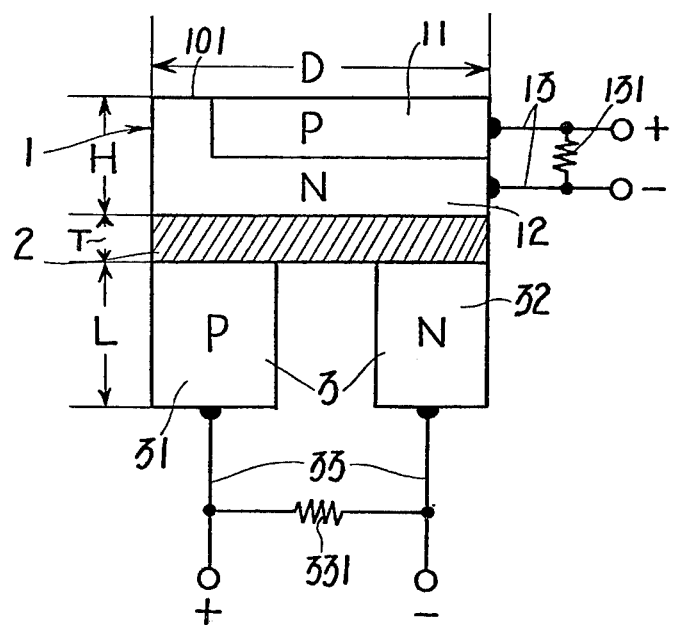

United States Patent [19]

Shigemasa

[11] 3,956,017
[45] May 11, 1976

[54] OPTOELECTRIC TRANSDUCER
[75] Inventor: Junichiro Shigemasa, Yamatokoriyama, Japan
[73] Assignee: Sharp Kabushiki Kaisha, Osaka, Japan
[22] Filed: Apr. 9, 1975
[21] Appl. No.: 566,186

[30] Foreign Application Priority Data
Apr. 9, 1974 Japan .................. 49-40580

[52] U.S. Cl. ............................ 136/89; 136/206
[51] Int. Cl.² ................. H01L 31/04; H01L 35/00
[58] Field of Search .......................... 136/89, 206

[56] References Cited
UNITED STATES PATENTS

| 2,407,678 | 9/1946 | Ohl | 136/206 |
|---|---|---|---|
| 2,588,254 | 3/1952 | Lark-Horovitz et al. | 136/89 |
| 3,331,707 | 7/1967 | Werth | 136/89 |
| 3,433,676 | 3/1969 | Stein | 136/89 |
| 3,480,781 | 11/1969 | Mandalakas | 136/89 X |

FOREIGN PATENTS OR APPLICATIONS

| 225,284 | 8/1968 | U.S.S.R. | 136/89 |

OTHER PUBLICATIONS

B. Wedlock, "Thermo–Photo–Voltaic Energy Conversion", Proceedings of IEEE, Vol. 52, pp. 694–698, May 1963.

Primary Examiner—T. Tung
Assistant Examiner—Aaron Weisstuch
Attorney, Agent, or Firm—Stewart and Kolasch, Ltd.

[57] ABSTRACT

A metal layer made of a high heat conductivity material such as silver or aluminum is provided at the rear surface of a solar battery with the use of vacuum evaporation technology. A thermoelectric converter is attached to the metal layer in a manner to convert solar energy into electric energy by means of not only the optoelectric effect but also the thermoelectric effect. The solar battery can be maintained at its preferred operative temperature by the metal layer and the thermoelectric converter.

12 Claims, 2 Drawing Figures

OPTOELECTRIC TRANSDUCER

The present invention relates to an optoelectric transducer for converting solar energy into electric energy, and more specifically to a transducer comprising a solar cell, a heat conduction metal layer and a thermoelectric converter.

A silicon solar cell of the P - N junction type is sensitive to radiant energy of wavelength of 5,000 A to 12,000 A especially 8000 A. Radiation of wavelength longer than the above-mentioned range can not be used for exciting electrons and, therefore, is converted into heat energy. Radiation of wavelength shorter than the above-mentioned range and even within the above-mentioned range is converted not only into electric energy but also into heat energy. The solar cell is unavoidably heated and the undesired temperature rise causes a reduction of conversion efficiency of the solar cell.

Accordingly, an object of the present invention is to provide a novel optoelectric transducer for converting solar energy into electric energy at high efficiency.

Another object of the present invention is tu utilize heat energy created within a solar cell for to electric energy.

Still another object of the present invention is to maintain a solar cell at its preferred operative temperature.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to the present invention, a metal layer made of a high heat conductivity material such as silver and aluminum is provided at the rear surface of a silicon solar cell with the use of vacuum evaporation technology. A thermoelectric converter is soldered to the metal layer. Electric energy can be generated from the solar cell and the thermoelectric converter. Moreover, temperature rise of the solar cell can be reduced by the metal layer or the thermoelectric converter.

Figure 2:
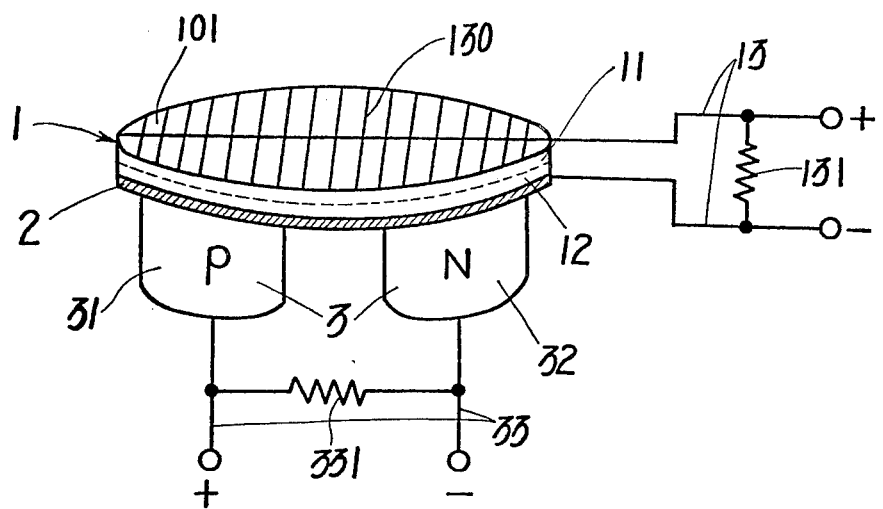

The present invention will become more fully understood from the detailed description given hereinbelow and the accompanying drawings which are given by way of illustration only, and thus are not limitative of the present invention and wherein, FIG. 1 is a schematic sectional view showing an embodiment of the present invention; and FIG. 2 is a schematic perspective view showing another embodiment of the present invention.

Referring now to FIG. 1, there is illustrated an embodiment of an optoelectric transducer of the present invention which comprises a silicon solar cell 1 of the conventional P - N junction type, a heat conduction metal layer 2 and a thermoelectric converter 3. The silicon solar cell 1 can be of a conventional construction and includes a P - type semiconductor layer 11 and an N - type semiconductor layer 12. The silicon solar cell 1 can be of a columnar configuration of which diameter D is about 5 cm and height H is about 0.4 mm.

The upper surface 101 of the solar cell 1 is exposed to radiation. A pair of lead wires 13 are soldered to the solar cell 1 in order to output electric energy generated by the solar cell 1. A load resistance 131 is connected to the pair of lead wires 13.

The heat conduction metal layer 2 is made of a high heat conductivity material such as silver or aluminum and is provided at the rear surface of the solar cell 1 with the use of vacuum evaporation technology. Thickness T of the heat conduction metal layer 2 is preferably 10 to 20 $\mu$m.

The thermoelectric converter 3 comprises a P - type semiconductor 31 including bismuth, selenium and tellurium at proper concentration, and an N - type semiconductor 32 including antimony, bismuth and tellurium at proper concentration as is well known in the art. The thermoelectric converter 3 is attached to the heat conduction metal layer 2 with the use of soldering technology. Length L of the thermoelectric converter 3 is 2 mm to 2 cm and preferably about 1 cm. Electric energy generated by the thermoelectric converter 3 is led out through a pair of lead wires 33 respectively which are soldered to the P - type semiconductor 31 and the N - type semiconductor 32. A load resistance 331 is provided between the pair of lead wires 33.

When the upper surface 101 of the solar cell 1 is exposed to radiation, the solar cell 1 provides output voltage through the pair of lead wires 13 by means of the optoelectric effect. At the same time the solar cell 1 is heated and the heat energy created within the solar cell 1 is transferred to the thermoelectric converter 3 through the heat conduction metal layer 2. The solar cell 1 must be maintained below than 170°C. In this embodiment the solar cell 1 is maintained at around 90°C because of provision of the heat conduction metal layer 2 and the thermoelectric converter 3. The heat energy created within the solar cell 1 can be converted into electric energy by the thermoelectric converter 3 by means of the Seebeck effect and is led out through the pair of lead wires 33.

FIG. 2 shows another embodiment of the optoelectric transducer of the present invention wherein like elements corresponding to those of FIG. 1 are indicated by like numerals. A comb shaped electrode 130 is provided on the upper surface 101 of the solar cell 1 with the use of vacuum evaporation technology in order to enhance the optoelectric conversion efficiency. The pair of lead wires 13 are connected with the comb shaped electrode 130 and the heat conduction metal layer 2, which serves as an ohmic contact electrode for the solar cell 1.

The invention being thus described, it will be obvious that the same way be varied in many ways. Such variations are not to be regarded as a departure from the spirit and scope of the invention, and all such modifications are intended to be included within the scope of the following claims.

What is claimed is:

1. An optoelectric transducer comprising:
   a solar cell having two major surfaces, one of which is exposed to radiation;
   a heat conduction metal layer attached to the other major surface of the solar cell;
   a thermoelectric converter attached to the heat conduction metal layer; and
   lead wires separately connected to the solar cell and the thermoelectric converter in order to provide output of the electric energy generated by the solar cell and the thermoelectric converter.

2. The optoelectric transducer of claim 1 wherein the solar cell is a silicon solar cell of the P - N junction type.

3. The optoelectric transducer of claim 1 wherein the solar cell is of a columnar configuration of which the diameter is about 5 cm and the height is about 0.4 mm.

4. The optoelectric transducer of claim 1 wherein the heat conduction metal layer is provided with the use of vacuum evaporation technology.

5. The optoelectric transducer of claim 1 wherein the heat conduction metal layer is made of a high heat conductivity material such as silver or aluminum.

6. The optoelectric transducer of claim 1 wherein the thickness of the heat conduction metal layer is about 20 $\mu$m.

7. The optoelectric transducer of claim 1 wherein the thermoelectric converter comprises an N - type semiconductor including antimony, bismuth and tellurium at proper concentration, and a P - type semiconductor including bismuth, selenium and tellurium at proper concentration.

8. The optoelectric transducer of claim 1 wherein the thermoelectric converter is attached to the heat conduction metal layer through the use of soldering technology.

9. The optoelectric transducer of claim 1 wherein the thermoelectric converter comprises a pair of columnar shaped semiconductors, each having a height of about 1 cm.

10. The optoelectric transducer of claim 1 further comprising a comb shaped electrode attached to the upper surface of the solar cell and connected to the lead wires.

11. The optoelectric transducer of claim 10 wherein the comb shaped electrode is provided through the use of vacuum evaporation technology.

12. The optoelectric transducer of claim 10 wherein the lead wires are connected with the comb shaped electrode and the heat conduction metal layer in order to output electric energy generated by the solar cell.

* * * * *